US008622678B2

(12) United States Patent
Liu

(10) Patent No.: US 8,622,678 B2
(45) Date of Patent: Jan. 7, 2014

(54) NUT ASSEMBLY

(75) Inventor: Cong Liu, Shenzhen (CN)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 122 days.

(21) Appl. No.: 13/275,456

(22) Filed: Oct. 18, 2011

(65) Prior Publication Data
US 2012/0288346 A1    Nov. 15, 2012

(30) Foreign Application Priority Data
May 13, 2011  (CN) ...................... 2011 2 0152605 U

(51) Int. Cl.
*F16B 37/14*    (2006.01)
(52) U.S. Cl.
USPC ....................................... 411/429; 411/372.6

(58) Field of Classification Search
USPC ................... 411/431, 429, 372.5–373, 377, 411/119–121
See application file for complete search history.

(56) References Cited

U.S. PATENT DOCUMENTS

| | | | | | |
|---|---|---|---|---|---|
| 1,900,098 | A | * | 3/1933 | Cooper | 220/257.1 |
| 5,017,068 | A | * | 5/1991 | Cooksey | 411/373 |
| 5,350,266 | A | * | 9/1994 | Espey et al. | 411/431 |
| 5,480,273 | A | * | 1/1996 | Jou | 411/373 |
| 5,586,790 | A | * | 12/1996 | Bynum | 285/89 |
| 5,624,218 | A | * | 4/1997 | Dauwalter | 411/87 |
| 7,713,012 | B2 | * | 5/2010 | Coonjohn | 411/372.6 |

* cited by examiner

*Primary Examiner* — Flemming Saether
(74) *Attorney, Agent, or Firm* — Altis Law Group, Inc.

(57) ABSTRACT

A nut assembly includes a nut and an carrier. The nut defines a number of latching grooves. The carrier includes a planar board and a number of flexible holding elements protruding from the planar board. Each flexible holding element is releasably latched in one of the latching grooves to latch the carrier to the nut. The carrier is capable of moving relative to the nut from a first state to a second state, so the flexible holding elements slide out of the latching grooves to release the carrier from the nut.

8 Claims, 4 Drawing Sheets

NUT ASSEMBLY

BACKGROUND

1. Technical Field

This disclosure relates to nut assemblies, particularly to a nut assembly with a carrier.

2. Description of Related Art

A nut is a type of hardware fastener with a threaded hole. Nuts are almost always used opposite a mating bolt to fasten a stack of parts together. In manufacture, the nut is carried by a vacuum suction cup, and then assembled with a nut hole or a mating bolt. However, the shapes of different nuts may be different, so there is a requirement of designing different vacuum suction cups, each of which has a shape according to one of the different nuts. Additionally, the nut defines a threaded hole so it is difficult to attach the nut by the vacuum suction cup if the vacuum suction cup is not aligned with the nut precisely.

Therefore, there is a room for improved in the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary nut assembly. Moreover, in the drawings like reference numerals designate their respective parts throughout the several views. Wherever possible, the same reference numbers are used throughout the drawings to refer to the same or like elements of an embodiment.

DETAILED DESCRIPTION

Figure 1:
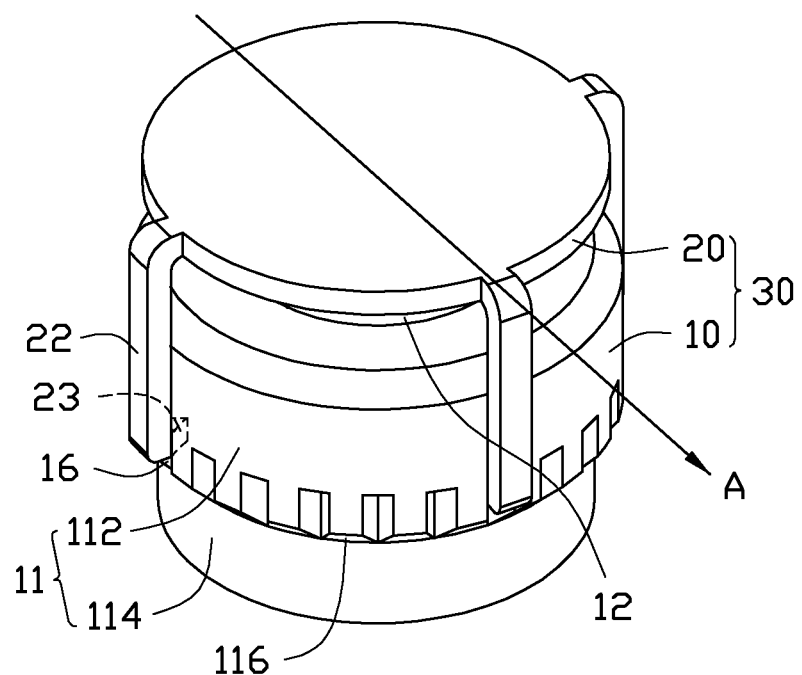
FIG. 1 is a schematic view of an exemplary embodiment of a nut assembly in a first state.

Referring to FIG. 1, an exemplary embodiment of a nut assembly 30 includes a nut 10 and an carrier 20.

Figure 2:
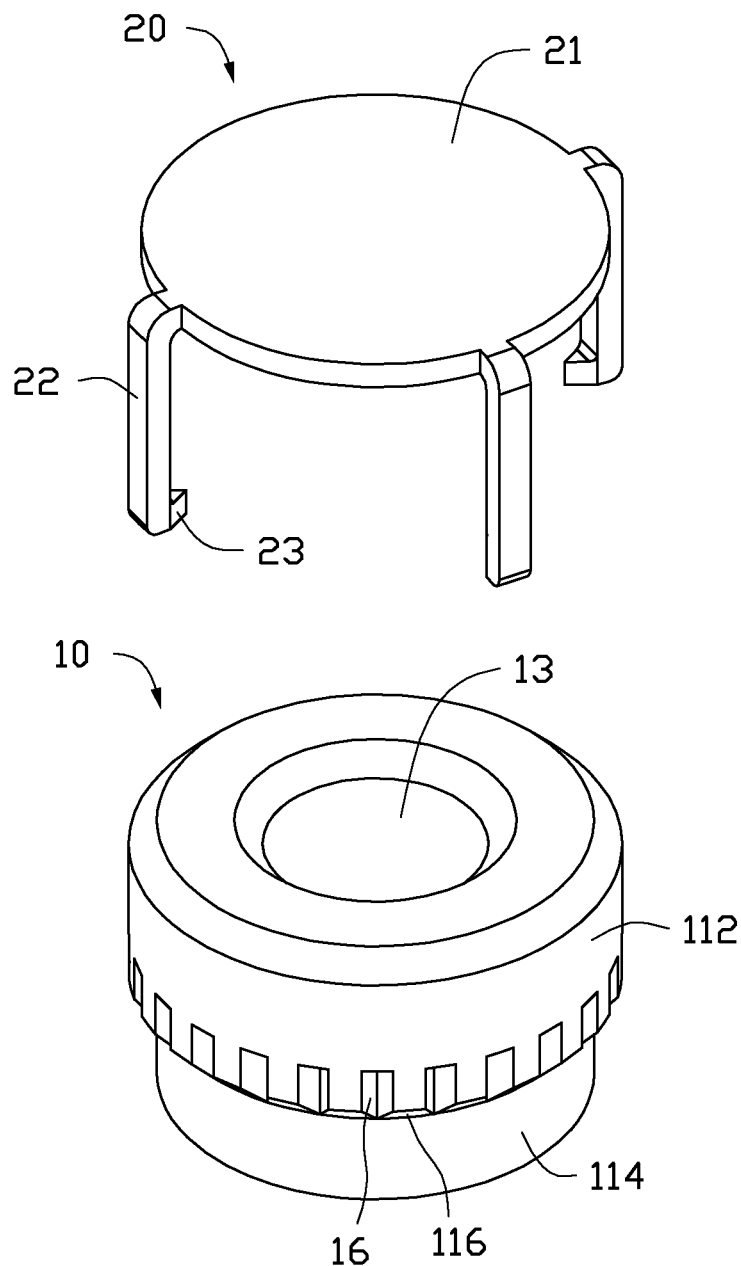
FIG. 2 is an exploded view of the nut assembly of FIG. 1.

Referring to FIG. 2, the nut 10 includes a main body 11 and a threaded hole 13 defined through the main body 11. In this exemplary embodiment, the main body 11 is stepped, includes a first cylindrical body 112 and a second cylindrical body 114 protruding from an end of the first cylindrical body 112. The first cylindrical body 112 is larger than the second cylindrical body 114 so a shoulder 116 is formed between the first cylindrical body 112 and the second cylindrical body 114. The nut 10 further defines a plurality of latching grooves 16 for latching with the carrier 20. In this exemplary embodiment, the latching grooves 16 are defined in an outer surface of the first cylindrical body 112 and extend through the shoulder 116.

Figure 4:
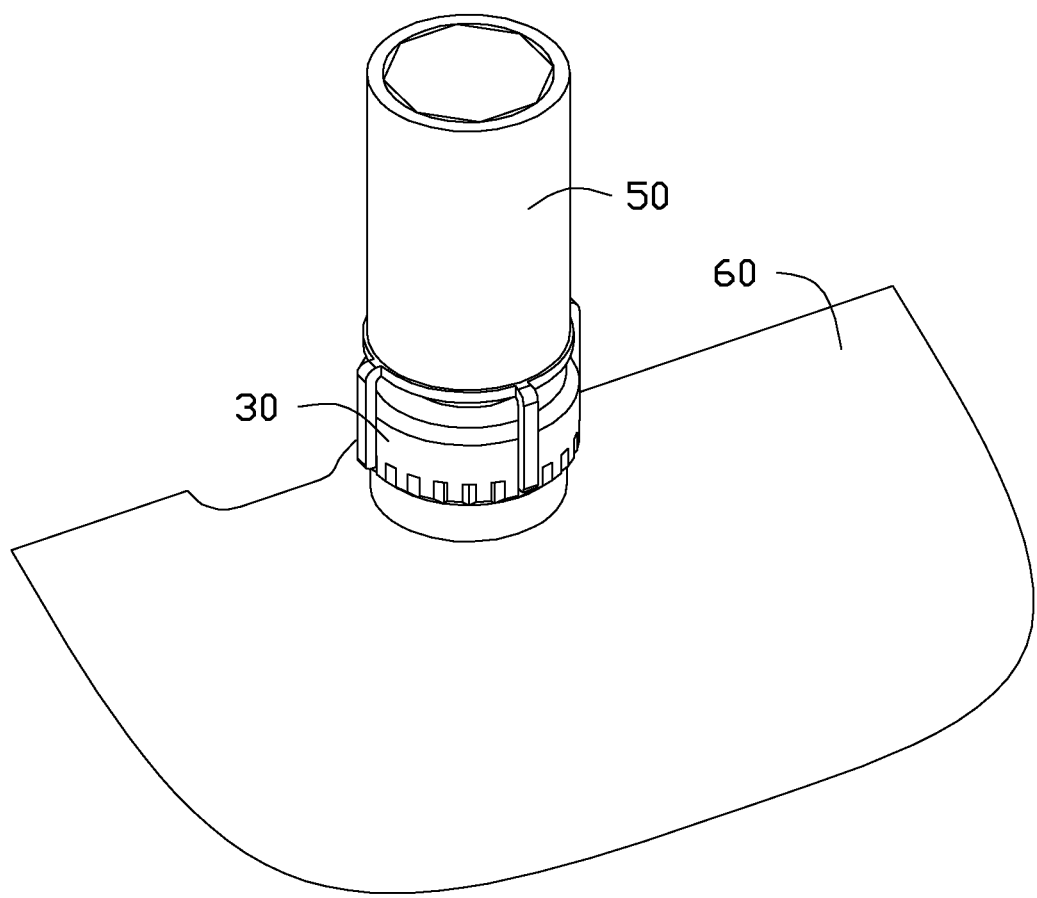
FIG. 4 is a schematic view of the nut assembly of FIG. 1 assembled to a circuit board.

The carrier 20 includes a planar board 21 and a plurality of flexible holding elements 22 protruding from the planar board 21 corresponding to the latching grooves 16. The planar board 21 provides an attaching surface facilitating sucking the nut 10 by a vacuum suction cup 50 (FIG. 4). A distal end of each flexible holding element 22 forms a hook 23, which is latched in one of the latching grooves 16 to latch the carrier 20 to the nut 10 so the nut assembly 30 is in a first state shown in FIG. 1. For reasons discussed below, the flexible holding elements do not completely surround the nut 10 and typically, should surround no more than 180 degrees of circumference.

Figure 3:
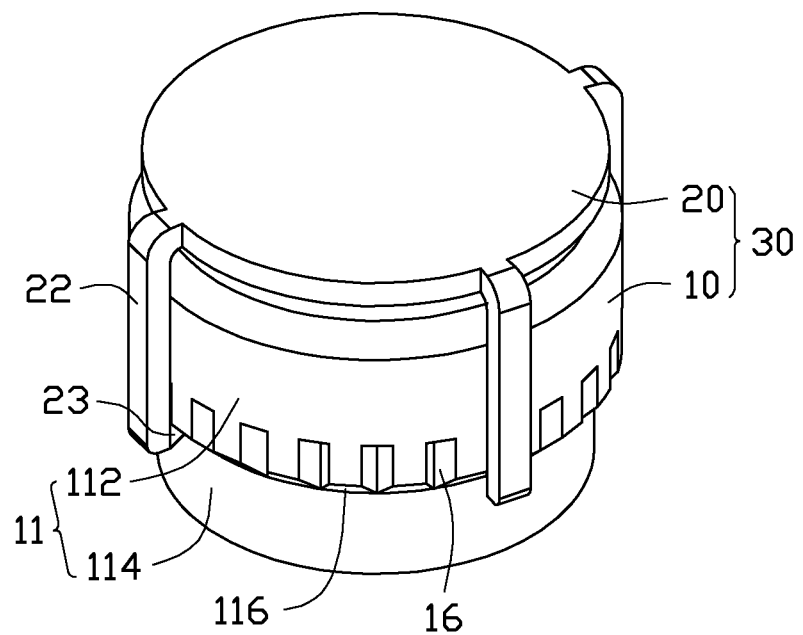
FIG. 3 is another schematic view of the nut assembly of FIG. 1 in a second state.

Referring to FIG. 1, when the nut assembly 30 is in the first state, the planar board 21 is spaced from the nut 10 so a gap 12 is defined between the planar board 21 and the nut 10. Thus, when the carrier 20 is pressed, the carrier 20 can move toward the nut 10 to slide the hooks 23 out of the latching grooves 16 so the nut assembly 30 is in a second state shown in FIG. 3. Once the hooks 23 slide out of the latching grooves 16, the latching engagement of the carrier 20 and the nut 10 is released, so the carrier 20 can be transversely removed from the nut 10 in the direction of arrow A.

Referring to FIG. 4, during assembling the nut 10 to a circuit board 60. The vacuum suction cup 50 is aligned with and sucks the planar board 21 so the nut assembly 30 is sucked by the vacuum suction cup 50. The nut assembly 30 is then positioned on the circuit board 60. The vacuum suction cup 50 moves toward and drives the planar board 21 to move toward the nut 10, until the hooks 23 slide out of the latching grooves 16 like shown in FIG. 3. The vacuum suction cup 50 moves transversely to drive the carrier 20 to remove from the nut 10.

It is to be further understood that even though numerous characteristics and advantages of the exemplary embodiments have been set forth in the foregoing description, together with details of structures and functions of various embodiments, the disclosure is illustrative only, and changes may be made in detail, especially in matters of shape, size, and arrangement of parts within the principles of the exemplary invention to the full extent indicated by the broad general meaning of the terms in which the appended claims are expressed.

What is claimed is:

1. A nut assembly comprising:
   a nut including a main body, the main body defining a plurality of latching grooves;
   a carrier including a planar board and a plurality of flexible holding elements protruding from the planar board;
   wherein in a first state, each flexible holding element is latched in one of the latching grooves to latch the carrier to the nut; in a second state, the flexible holding elements slide out of the latching grooves to release the carrier from the nut;
   wherein the main body is stepped, includes a first cylindrical body and a second cylindrical body protruding from an end of the first cylindrical body; the first cylindrical body is larger than the second cylindrical body so a shoulder is formed between the first cylindrical body and the second cylindrical body; the latching grooves are defined in an outer surface of the first cylindrical body and extend through the shoulder.

2. The nut assembly of claim 1, wherein a distal end of each flexible holding element is bent inwardly to form a hook, which is latched in one of the latching grooves to latch the carrier to the nut.

3. The nut assembly of claim 2, wherein when the nut assembly is in the first state, the planar board is spaced from the nut so a gap is defined between the carrier and the nut.

4. The nut assembly of claim 3, wherein when the carrier is pressed, the carrier can move toward the nut to make the hooks slide out of the latching grooves until the nut assembly is in the second state.

5. A nut assembly comprising:
   a nut including a shoulder and defining a plurality of latching grooves, the latching grooves extending through the shoulder;

a carrier including a planar board and a plurality of flexible holding elements protruding from the planar board, each flexible holding element including a hook releasably latched in one of the latching grooves to latch the carrier to the nut;

wherein the carrier is capable of moving relative to the nut from a first state to a second state, so the hooks of the flexible holding elements slide out of the latching grooves to release the carrier from the nut;

wherein the nut includes a main body, the main body is stepped, includes a first cylindrical body and a second cylindrical body protruding from an end of the first cylindrical body; the first cylindrical body is larger than the second cylindrical body so the shoulder is formed between the first cylindrical body and the second cylindrical body; the latching grooves are defined in an outer surface of the first cylindrical body and extend through the shoulder.

6. The nut assembly of claim 5, wherein a distal end of each flexible holding element is bent inwardly to form the hook, which is latched in one of the latching grooves to latch the carrier to the nut.

7. The nut assembly of claim 6, wherein when the nut assembly is in the first state, the planar board is spaced from the nut so a gap is defined between the carrier and the nut.

8. The nut assembly of claim 7, wherein when the carrier is pressed, the carrier can move toward the nut to make the hooks slide out of the latching grooves until the nut assembly is in the second state.

* * * * *